United States Patent [19]
Lynch

[11] Patent Number: 5,892,272
[45] Date of Patent: Apr. 6, 1999

[54] INTEGRATED CIRCUIT WITH ON-CHIP GROUND BASE

[75] Inventor: Brian J. Lynch, Milpitas, Calif.

[73] Assignee: LSI Logic Corporation, Milpitas, Calif.

[21] Appl. No.: 867,286

[22] Filed: Jun. 2, 1997

Related U.S. Application Data

[63] Continuation of Ser. No. 578,741, Dec. 26, 1995, abandoned, which is a continuation of Ser. No. 277,344, Jul. 19, 1994, Pat. No. 5,482,897.

[51] Int. Cl.$^6$ ............... H01L 23/495; H01L 23/053; H01L 23/34; H01L 23/48
[52] U.S. Cl. ............... 257/668; 257/701; 257/728; 257/737; 257/780
[58] Field of Search ............... 257/664, 668, 257/691, 701, 728, 758, 737, 780, 738, 778

[56] References Cited

U.S. PATENT DOCUMENTS

| | | |
|---|---|---|
| 4,837,609 | 6/1989 | Gurvitch et al. ............... 257/43 |
| 5,021,300 | 6/1991 | Stacey ............... 257/750 |
| 5,027,189 | 6/1991 | Shannon et al. ............... 257/783 |
| 5,036,379 | 7/1991 | Smith et al. ............... 257/668 |
| 5,072,520 | 12/1991 | Nelson ............... 29/852 |
| 5,099,306 | 3/1992 | Dunaway et al. ............... 257/666 |
| 5,331,204 | 7/1994 | Kuroda et al. ............... 257/758 |

*Primary Examiner*—Teresa M. Arroyo

[57] ABSTRACT

An integrated circuit includes a ground plane structure which provides a uniform ground potential throughout the integrated circuit and improves its performance. The ground plane structure is carried atop the active circuit elements of the integrated circuit and connects with each of the ground-potential contact pads of the circuit. A method of making the integrated circuit includes applying a ground plane precursor structure over all of the integrated circuit topology, and removing portions of the precursor structure where the ground plane is not desired. A method of providing bump structures at each of the contact pads for use in TAB bonding of the electrical connections of the integrated circuit to a package structure is also set forth.

51 Claims, 4 Drawing Sheets

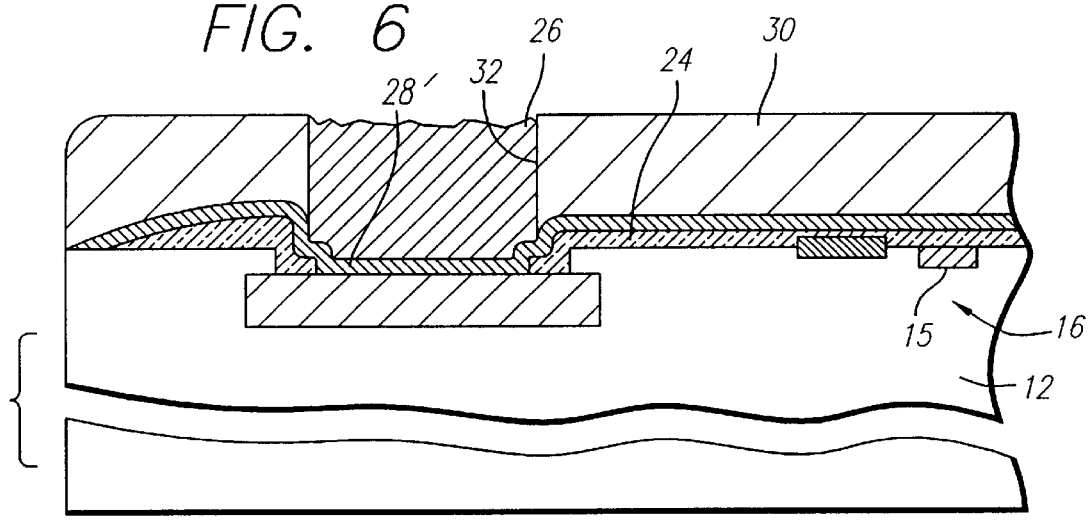
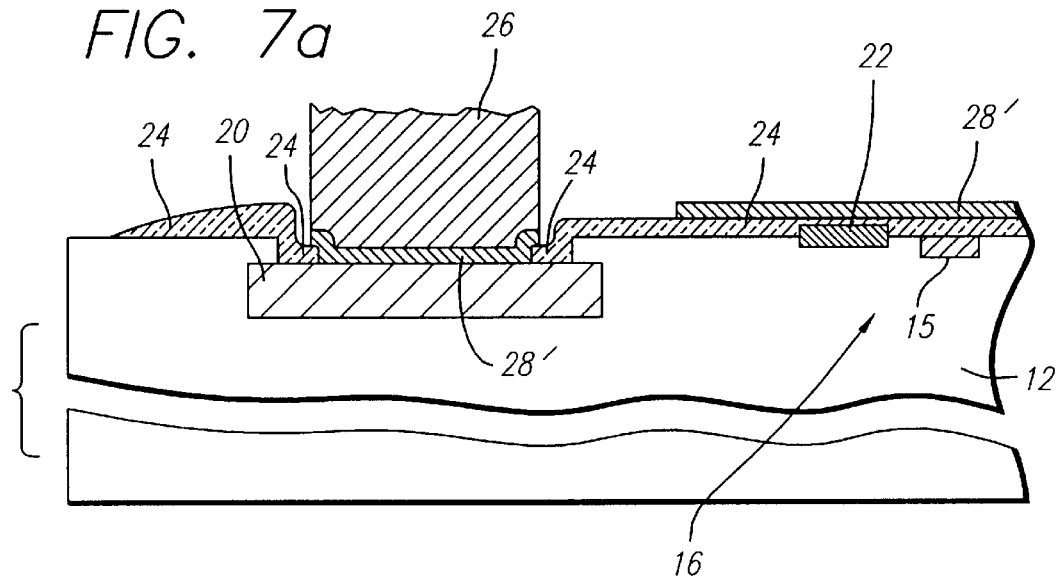
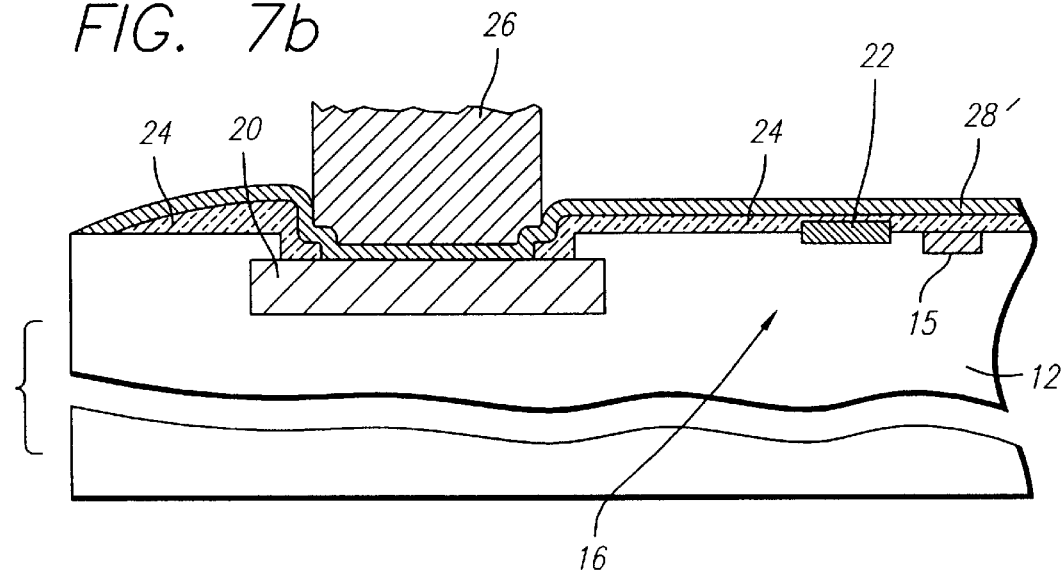

INTEGRATED CIRCUIT WITH ON-CHIP GROUND BASE

This application is a continuation of U.S. patent application Ser. No. 08/578,741, filed Dec. 26, 1995, now abandoned; which is a continuation of U.S. patent application Ser. No. 08/277,344 filed Jul. 19, 1994, which is now U.S. Pat. No. 5,482,897 issued Jan. 9, 1996.

BACKGROUND OF THE INVENTION

1. Field of the Invention

The present invention is in the field of integrated circuits. More particularly, the present invention relates to an integrated circuit of the type which is formed of multiple fine-dimension circuit elements disposed in a planar central area on a die or chip of semiconductor material. Around the central area of the chip, and around the multitude of fine-dimension circuit elements thereon, is disposed a peripheral array of electrical contact pads by which the integrated circuit is electrically connected to a package structure for the integrated circuit chip, and to external electrical circuitry. The present invention relates to such an integrated circuit having a conductive ground plane overlying the active fine-dimension circuit elements, and carried upon an electrically insulative passivation layer of the integrated circuit. The conductive ground plane is connected electrically to the ground-potential electrical contact pads of the integrated circuit.

2. Related Technology

Integrated circuits have found wide application in contemporary devices requiring electrical circuitry for sensing, information storage and retrieval, control, calculation, operation monitoring, safety improvement, information and status display, and a wide variety of other purposes connected with the devices. In fact, many aspects of contemporary devices which, previous to the development of such integrated circuits, would have had to be implemented with analogue circuitry, and also possibly with the use of hard-wired connections, are now easily implemented in a very small size and at light weight and low power consumption with the use of contemporary integrated circuits. The functions and features which these integrated circuits make available in contemporary devices would be very difficult or impossible to implement using the old hard-wired circuit constructions commonly used in years past. Such old-style construction techniques would effectively prohibit the making of many contemporary devices because of cost, size, weight, and power consumption considerations.

Further, many of these contemporary integrated circuits are ASIC (application specific integrated circuit) type, and are designed and manufactured for a specific application or range of related applications. Because of their specialization to perform a specific task or range of tasks, these ASIC type of integrated circuits bring even greater advantages in reducing size, weight, and power consumption; while improving functions, features, and ease of use in comparison to the general-purpose integrated circuits now available.

However, as integrated circuits grow in size and complexity, the interconnection lengths on the circuit chips increase, and transmission line effects have a negative impact on the quality of the performance provided by the integrated circuits. Because of the necessity to use all of the layers of electrical interconnection within the fine-dimension circuit element features which it is possible to produce with current technology just to effect the necessary interconnections among these various circuit elements of the integrated circuit, it is not possible to devote a submerged layer of interconnection to the provision of a ground plane in the circuit. However, it is recognized that the provision of such a conductive ground plane could significantly improve the performance of integrated circuits.

SUMMARY OF THE INVENTION

In view of the above, it is a primary object for this invention to provide an integrated circuit having a uniform or common ground plane potential throughout the integrated circuit.

Another object for this invention is to provide such an integrated circuit having a conductive ground plane structure which is carried on, but which is electrically insulated generally from, the active circuit elements of the integrated circuit.

Yet another object for this invention is to provide such an integrated circuit with a ground plane structure which electrically connects with each of the ground-potential contacts of the integrated circuit.

An additional object for this invention is to provide a method of making such an integrated circuit.

Additional objects and advantages of the present invention will be apparent from a reading of the following detailed description of an exemplary apparatus embodying the present invention and of two exemplary methods of making such integrated circuits, taken in conjunction with the following drawing Figures, in which like reference numerals indicate the same feature, or features which are structurally or functionally analogous to one another.

DESCRIPTION OF THE DRAWING FIGURES

FIG. 1 provides a simplified and greatly enlarged plan view of an integrated circuit chip embodying the present invention;

FIGS. 3–7 are fragmentary cross sectional views similar to FIG. 2, and show the structure resulting from selected successive processing steps in the method of making an integrated circuit according to the present invention.

DETAILED DESCRIPTION OF A PREFERRED EXEMPLARY EMBODIMENT OF THE INVENTION

Figure 1:
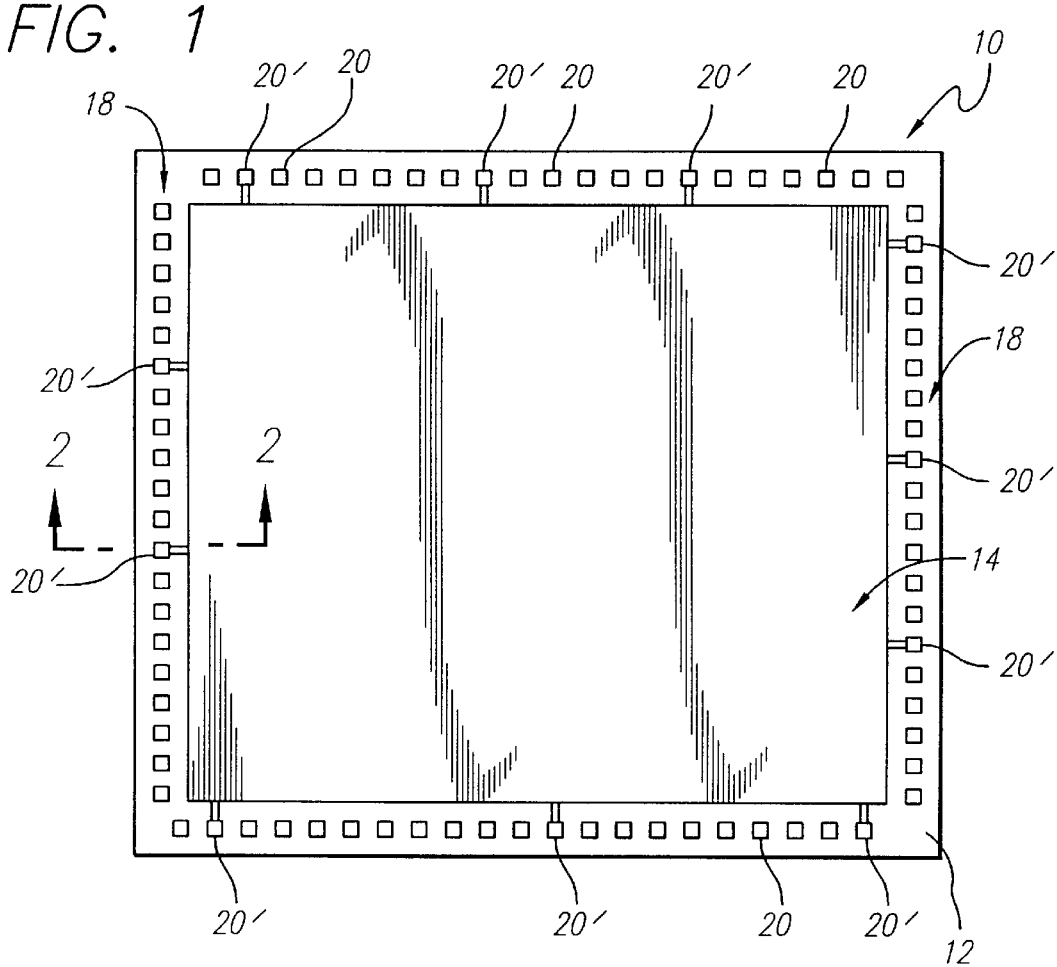
Figure 2:
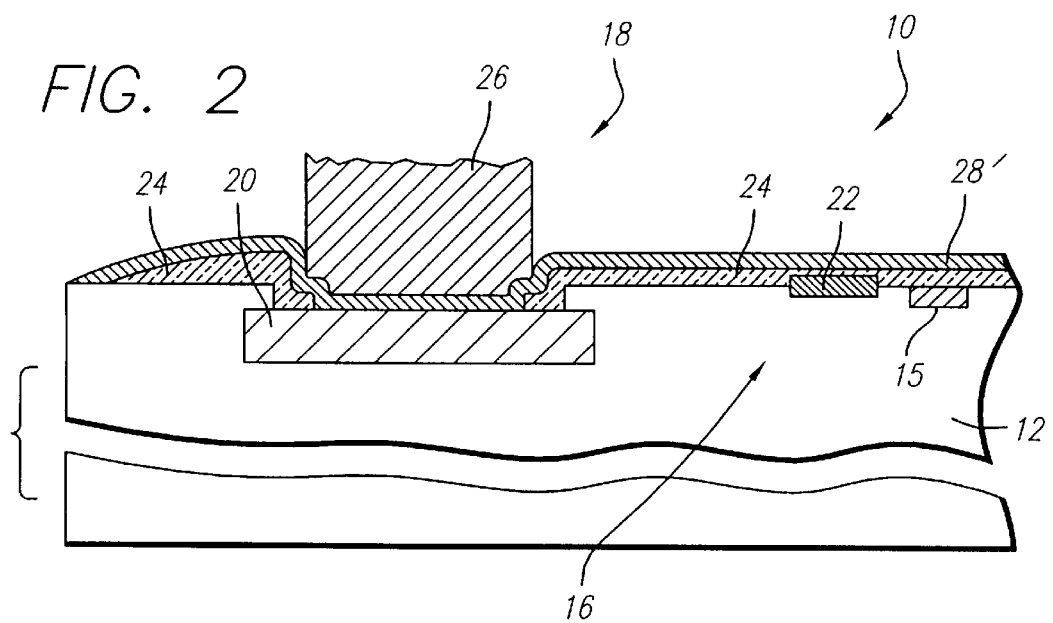
FIG. 2 is a fragmentary cross sectional view taken at line 2—2 of FIG. 1, and is similarly simplified with respect to morphological features of the fine-dimension circuit elements of the integrated circuit in order to improve clarity of illustration of the invention.
Figure 3:
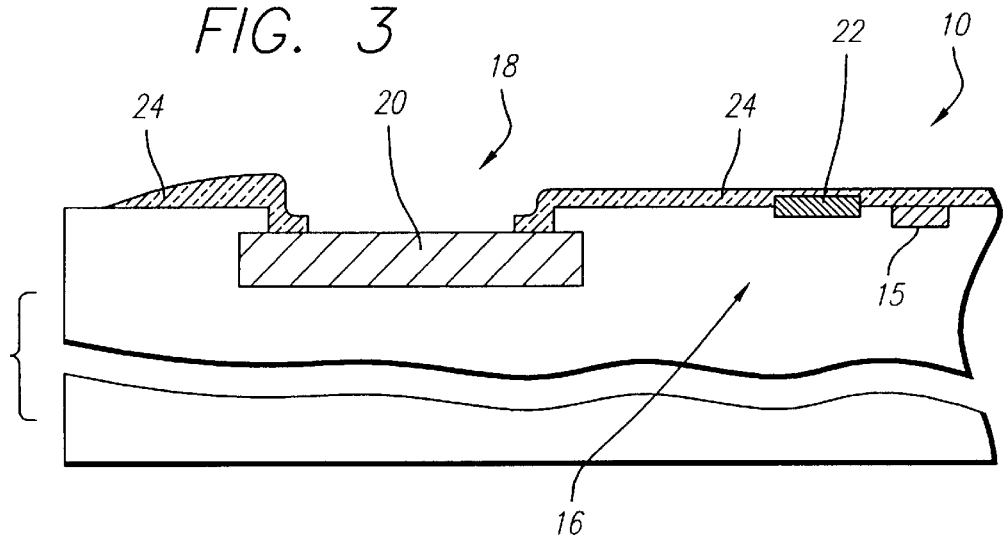

Viewing FIGS. 1 and 2 in conjunction with one another, an integrated circuit 10 is seen which includes a substrate 12 of semiconductor material, such as silicon. On this substrate and within a central area thereof (generally referenced with the numeral 14) is formed a multitude of fine-dimension electrical circuit features and active circuit elements 15, such as diodes, transistors, and capacitors, for example, (not visible on FIG. 1) which are conventional. These fine-dimension electrical circuit features and elements 15 are built up using conventional sputtering, doping, electroplating, vapor-phase deposition, etching, photolithographic techniques, and other techniques of integrated circuit fabrication, so that a morphology or thickness of circuit structural features, generally referenced in FIG. 2 with the numeral 16, exists in the integrated circuit 10.

Outside of the central area 14 of the circuit 10, and in a peripheral area referenced with the numeral 18, is disposed a plurality of electrical contact pads 20. The contact pads 20 are employed to electrically connect individually to particular features and active elements 15 of the circuit 10 for interfacing this circuit with a package (not shown). The integrated circuit package, as is well-known, will provide both environmental protection for the circuit 10 as well as electrical connection between the integrated circuit 10 and external electrical circuitry. Generally, the electrical contact pads 20 are electrically connected with the appropriate active electrical circuit features by conductive traces either on the surface of or submerged within the morphology 16 of the circuit 10. For example, FIG. 2 shows one exemplary conductive electrical trace 22, which is a surface trace with respect to the remainder of the circuit morphology 16. This trace 22, and generally the remainder of the surface of the integrated circuit 10 is covered by a layer 24 of passivating material.

The passivating material 24 is conventional, and is employed both to prevent migration of dopants from and of contaminants into the morphology of the circuit 10, for example.

The passivating material of the layer 24 may be a single layer of a material such as silicon oxide, or silicon nitride, or of a material such as a polyimide. Alternatively, the passivating layer 24 may include two or more layers of such materials. In other words, the passivation layer material 24 may include a layer of polyimide, for example, along with a layer of another material. Generally, the layer 24 of passivating material covers at least the entire upper surface of the area 14 of the integrated circuit 10, and perhaps all or a part of the peripheral area 18, with the exception of the connector pads 20. The connector pads 20 are exposed.

Viewing FIG. 2, an exemplary connector pad 20 is seen upon which an upwardly extending conductive metallic "bump" structure 26 is formed. The bump 26 is merely exemplary, and may be representative of other similar bumps formed at each of the connector pads 20. In other words, the integrated circuit 10 will include a bump structure 26 at each of the connector pads 20, including those connector pads 20' which are dedicated to ground connections of the circuit 10. A conductive metallic ground plane structure 28 connects all of the bumps 26 at connector pads 20' of the integrated circuit 10 to one another in order to provide a uniform ground potential connection throughout the integrated circuit 10, as is desired to improve the performance of the circuit. The ground plane structure 28 may be of area-coverage type, as is depicted in FIG. 1, or may be of other configurations, such as a network of conductive traces extending between and connecting the contact pads 20', or a star-burst type with a smaller central area-type ground plane which is also extended to each of the contact pads 20' by a respective radially-extending conductive trace portion. Of course, other configurations for the ground plane 28 are possible, according to the particular design of various integrated circuits and the economics of various manufacturing environments.

In order to achieve the bump structures 26 and the ground plane structure 28 at the desired locations of the circuit 10, the passivated integrated circuit as described above with openings in the passivation layer 24 at the contact pads 20 is additionally subjected to the following processing steps:

a) Sputtering of a barrier metal layer and then of a conductor metal layer over the entire surface of the passivation layer 24, including onto the exposed contact pads 20.

b) Photolithographic processing including application of photoresist, exposure, and removal of the photoresist layer over the contact pads 20;

c) Electroplating conductive metal to build up metallic thickness, and thereby to form the bump structures 26 on the contact pads 20 over the sputtered metallic barrier metal and conductor metal layers according to the masking pattern established in step b). This electroplating step will preferably be conducted using additional conductor metal;

d) Photolithographically patterning the ground plane structure 28 connecting with contact pads 20'. This ground plane 28 may cover the entire area 14 of the integrated circuit 10 as shown, or may cover only selected areas and have a variable pattern according to the particulars of the integrated circuit 10;

e) Removing the barrier metal and conductor metal layers where the ground plane 28 is not desired; and including removal of connection of this ground plane 28 to the bumps 26 at contact pads 20, while leaving connection of ground plane 28 to bumps 26 at contact pads 20';

f) Removal of remaining photoresist material;

g) Annealing the bumps 26 to facilitate TAB bonding.

Figure 4:
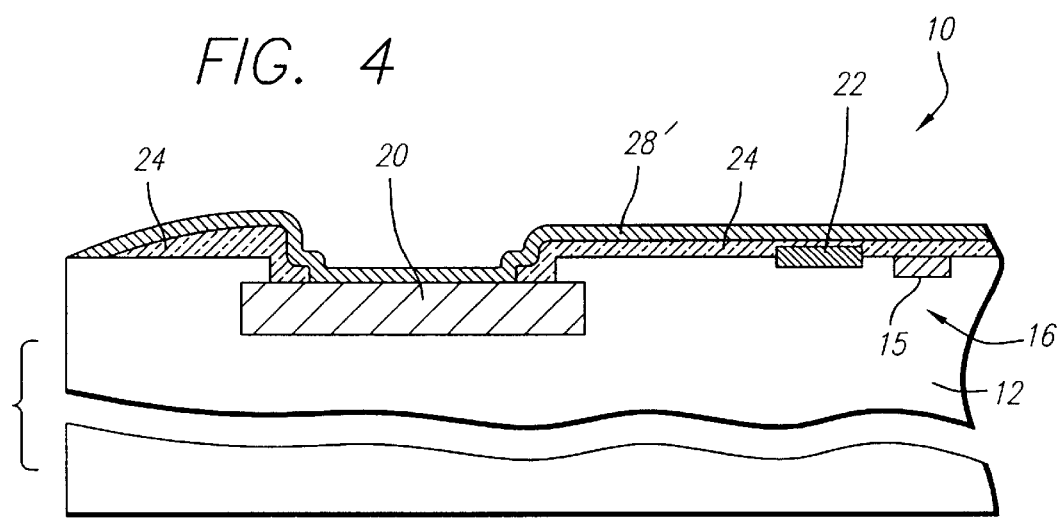

Considering now fragmentary cross sectional FIGS. 3, 4, 5, and 6, the starting structure (FIG. 3), and structures which result from the process steps a), b), and c) set out above are depicted. That is, FIG. 4 shows the passivated integrated circuit 10 with the overall coating of barrier metal and conductor metal resulting from step a), which coating is indicated with the numeral 28', and the remains of which will form the ground plane 28, as is described below. Preferably, the barrier metal is an alloy of titanium and tungsten, and is applied to a thickness of about 3000 angstroms. The conductor metal is preferably gold, and is applied to a thickness of about 2000 angstroms. Thus, the coating 28' has a total thickness of about 5000 angstroms. This overall coating or layer 28' of barrier metal and conductor metal contacts all of the contact pads 20 of the integrated circuit 10 so that at this stage of manufacturing, all of the contact pads 20 are electrically connected to one another.

Figure 5:
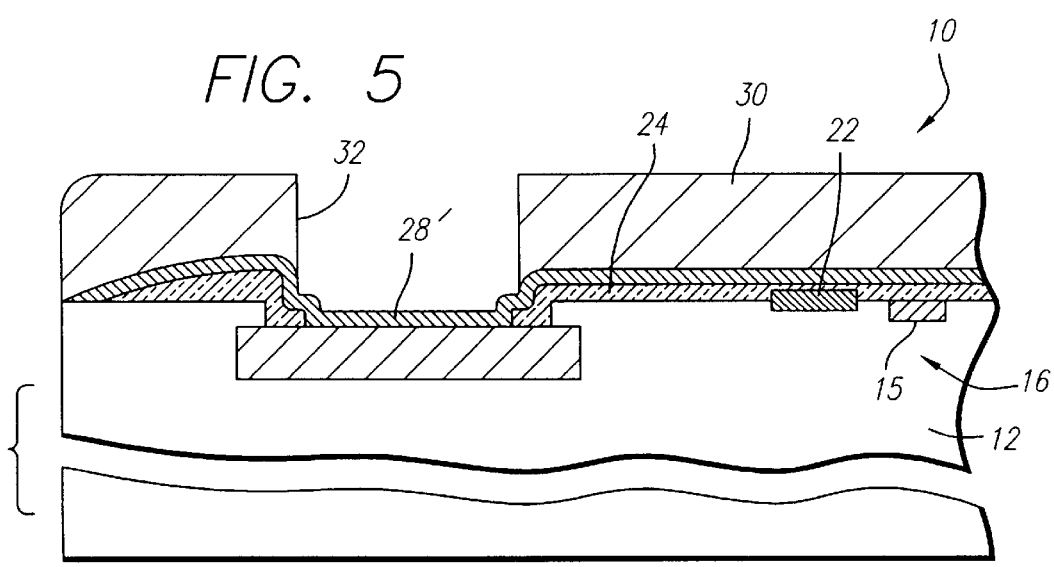

FIG. 5 shows the result of step b), with a layer of photoresist material 30 defining an opening 32 which exposes the contact pad 20 with its overlying layer of barrier metal and conductor metal 28'. The photoresist material 30 defines a similar opening 32 at each of the contact pads 20 of the circuit 10.

FIG. 6 illustrates the structure resulting from electroplating metal into the openings 32 of the photoresist material 30 and onto the coating of barrier metal and conductor metal 28'. The metal 26 or bump is shown atop the underlying layer of barrier metal and conductor metal 28. Each contact pad 20 has such a bump structure 26.

Now viewing FIG. 7a, the structure resulting at one of the contact pads 20 (which is not a ground-potential contact pad 20') is shown. At this contact pad 20, and at all of the other contact pads 20 which are not ground-potential contact pads 20', the conductive ground plane 28 is spaced from the contact pad 20 and does not connect thereto or to the bump 26 thereon. This aspect of the integrated circuit 10 may be further appreciated viewing FIG. 1 where it is seen that the ground plane 28 is spaced from and does not electrically connect to the contact pads 20 which are not ground-potential contact pads 20'. On the other hand, FIG. 7b shows the structure at an exemplary one of the contact pads 20' which is a ground-potential contact pad for the integrated circuit 10. At this contact pad 20', the ground plane 28 connects to the contact pad 20', and to the bump 26 thereon.

The structure shown in FIGS. 7a and 7b may be achieved in either of two alternative methods from that structure shown in FIG. 6. On the one hand, if the photoresist 30 used for the step c) is a positive-acting photoresist, then after the electroplating operation of step c) the photoresist may be additionally exposed with the pattern of the ground plane 28 as seen in FIG. 1. The unexposed photoresist 30 is then removed over the areas of the circuit 10 which are not to include the ground plane 28. Subsequently, the step e) of removing the ground plane layer 28' where it is not desired is conducted by etching away the exposed portion of layer 28'. That is, the part of layer 28' which is exposed is the portion around the contact pads 20 and bumps 26 thereon. This portion of the ground plane structure 28' is etched away. On the other hand, where the photoresist material 30 remains, the ground plane layer 28' is not etched away and remains in contact with the contact pads 20' and bumps 26 thereon to form the ground plane 28.

If the photoresist used for step c) is a negative-acting photoresist, it will be removed and another layer of photoresist is applied over the entire integrated circuit 10, is then masked, exposed, and the appropriate portion of photoresist at the contact pads 20 and other areas where the ground plane 28 is not desired is removed as described above. Next, the etching step e) is conducted to produce the structure seen in FIGS. 7a, 7b, and essentially that structure seen in FIGS. 1 and 2.

However, subsequent to step e), the photoresist 30 will remain on the area of ground plane 28, including on the contact pads 20' and bumps 26 thereon. The bumps 26 are used to effect electrical connection with the integrated circuit by means of a TAB (tape automated bonding) member with contacts located in positions matching those (20 and 20') of the integrated circuit 10 and also matching the contact locations of a package (not shown) for the circuit 10. This TAB will also have conductive traces connecting its contacts respectively to one another so that the integrated circuit 10 is properly interfaced electrically with its package. However, this electrical connection can not be effected through the photoresist remaining on the contacts 20' and bumps 26 thereon. Consequently, the step f) removes this remaining photoresist. Step g) subsequently anneals the bumps 26 to allow electrical connection to these bumps with the congruent contacts of the TAB by means of an ultrasonic pressure-bond process. Essentially, this ultrasonic pressure-bond process effects a micro-scale friction weld between the bumps 26 and respective contacts of the TAB under the effect of applied pressure and ultrasonic agitation.

Figure 8A:
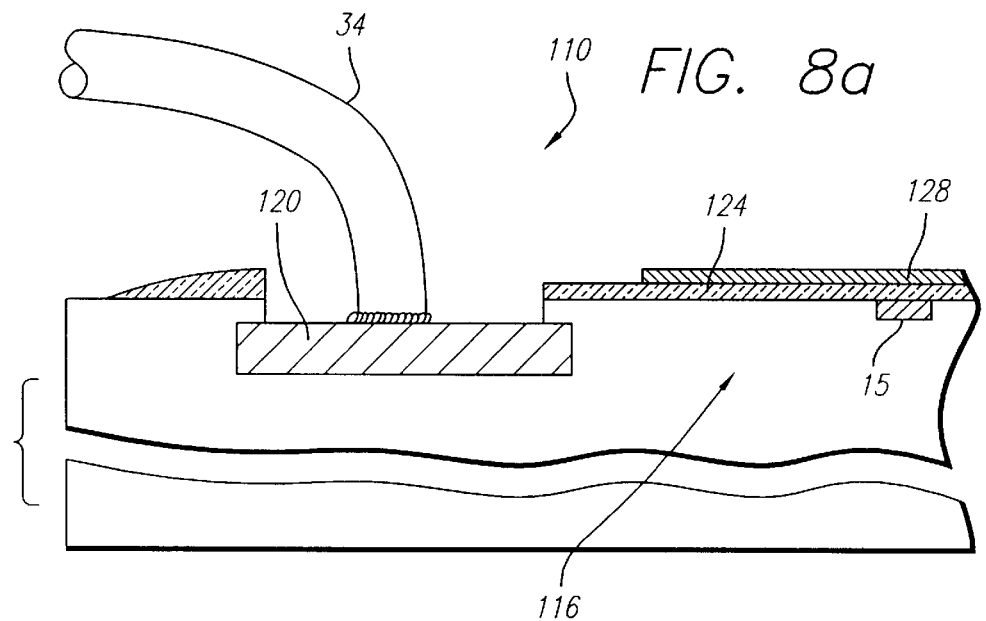
FIGS. 8 are fragmentary cross sectional views similar to FIGS. 3–7, and show an alternative embodiment of the present invention.
Figure 8B:
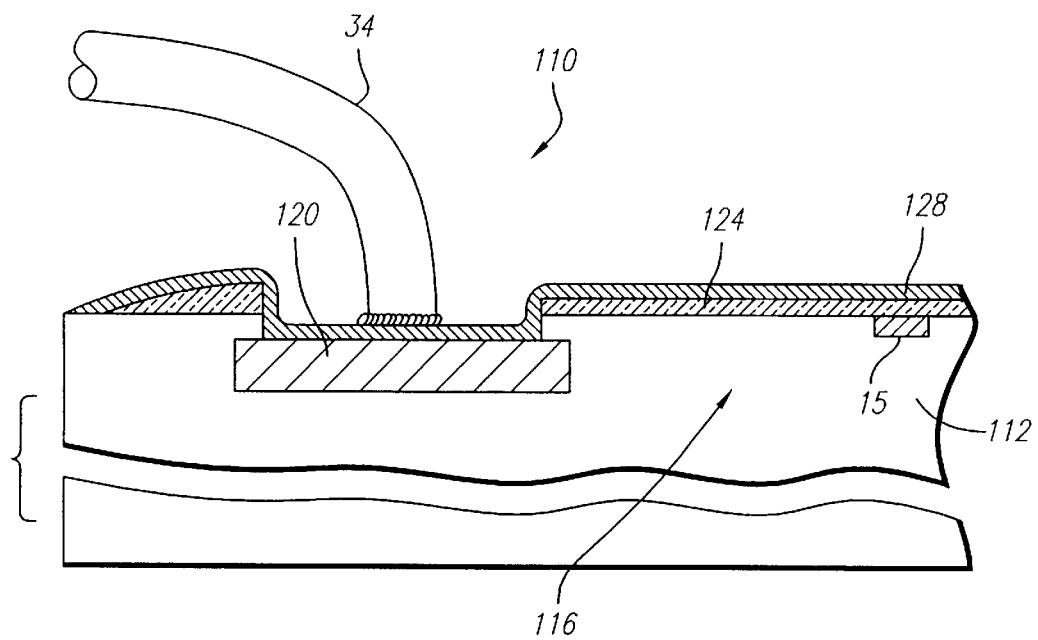

FIGS. 8a and 8b show an alternative embodiment of the invention. In order to obtain reference numerals for use in describing the structure of these Figures, features which are analogous in structure or function to those shown in FIGS. 1–7 are referenced with the same numeral used above, and having one-hundred (100) added thereto. The integrated circuit 110 of FIGS. 8 is configured for wire bonding electrical connection of the integrated circuit to its package, rather than the use of a TAB. A respective individual fine-dimension wire bond conductor 34 and 34' is shown in each of these Figures connecting directly to the contact pads 120, and 120'. Consequently, process steps b), c), and g), are not required with this embodiment of the invention because these process steps have to do with providing the bumps 26 seen in the earlier drawing Figures.

Ordinarily process step f) will still be performed for two reasons. First, the photoresist 130 remaining in the pattern of the ground plane 128, and on the contact pads 120', is a potential source of contamination during subsequent wire bonding. The elevated temperatures involved in performing such wire bonding would perhaps carbonize the photoresist material 130 and produce soot, smoke or other contaminants which are undesirable in the manufacturing environment. Secondly, while it may be possible to effect a satisfactory wire bond connection through the remaining photoresist on the contacts 120', such is probably not a desirable practice from the stand point of reliability of the electrical connection effected to the contact pads 120'. That is, the invention has as its purpose the achieving of a uniform ground-plane electrical potential throughout the integrated circuit 110. This uniformity of ground potential in the circuit 110 could possibly be compromised by one or more marginal or open connections to the ground-potential contacts 120' by the wire bond conductors 34'.

Nevertheless, it should be noted that the integrated circuit 110 according to the alternative embodiment of the invention is complete and operational after process step e), and without the removal of the remaining photoresist 130 in step f). Development of a satisfactory method of wire bond connection through the remaining photoresist material would render step f) unnecessary. Consequently, in a broad sense, the process necessary for making an integrated circuit according to the present invention could include only steps a), d), and e).

While the present invention has been depicted, described, and is defined by reference to particularly preferred embodiments of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

I claim:

1. An integrated circuit chip comprising:
   an integrated circuit chip semiconductor substrate;
   a plurality of fine-dimension integrated circuit chip elements carried on said substrate;
   an electrically insulative integrated circuit chip passivating layer carried atop said integrated circuit chip elements;
   an electrically conductive integrated circuit chip ground plane structure carried atop said passivating layer;
   said ground plane structure having a layer of barrier metal carried atop said passivating layer and a layer of conductor metal carried atop said layer of barrier metal; and
   a plurality of conductive integrated circuit chip metal bumps selectively applied and carried atop said ground plane structure.

2. The integrated circuit chip of claim 1 wherein said barrier metal includes a tungsten-titanium alloy.

3. The integrated circuit chip of claim 1 wherein said barrier metal layer has a thickness of substantially 3000 angstroms.

4. The integrated circuit chip of claim 1 wherein said conductor metal layers has a thickness of substantially 2000 angstroms.

5. The integrated circuit chip of claim 1 wherein said passivating layer includes materials selected from the group consisting of silicon oxide, silicon nitride, and polyimide.

6. The integrated circuit chip of 1 wherein said substrate defines a central area within which said plural fine-dimension integrated circuit elements are defined, said ground plane structure covering substantially all of said central area.

7. The integrated circuit chip of claim 6 wherein said semiconductor substrate defines a peripheral area surrounding said central area and carrying therein plural electrical contact pads for electrically interfacing said integrated circuit chip with external electrical circuitry, said plural electrical contact pads including ground-potential contact pads, and said ground plane structure extending into said peripheral area of said substrate to electrically connect with each of said ground-potential contact pads.

8. The integrated circuit chip of claim 7 further comprising an upwardly extending electrically conductive metallic bump structure carried upon each of said contact pads.

9. An integrated circuit chip comprising:
    an integrated circuit chip semiconductor substrate;
    a plurality of integrated circuit chip elements carried on said semiconductor substrate;
    an electrically insulative integrated circuit chip passivating layer carried atop said integrated circuit chip elements;
    an electrically conductive integrated circuit chip ground plane structure carried atop said passivating layer;
    said ground plane structure having a layer of barrier metal carried atop said passivating layer, and a layer of conductor metal carried atop said layer of barrier metal; and
    a plurality of conductive integrated circuit chip metal bumps selectively applied and carried atop said ground plane structure;
    said semiconductor substrate defining a central area within which said integrated circuit chip elements are defined, said ground plane structure covering substantially all of said central area.

10. The integrated circuit chip of claim 9 wherein said barrier metal includes a tungsten-titanium alloy.

11. The integrated circuit chip of claim 9 wherein said barrier metal layer has a thickness of substantially 3000 angstroms.

12. The integrated circuit chip of claim 9 wherein said conductor metal layer includes metallic gold.

13. The integrated circuit chip of claim 9 wherein said conductor metal layer has a thickness of substantially 2000 angstroms.

14. The integrated circuit chip of claim 9 wherein said passivating layer includes materials selected from the group consisting of silicon dioxide, silicon nitride, and polyimide.

15. The integrated circuit chip of claim 9 wherein said semiconductor substrate defines a peripheral area surrounding said central area and carrying therein plural electrical contact pads for electrically interfacing said integrated circuit with external electrical circuitry, said plural electrical contact pads including ground-potential contact pads, and said ground plane structure extending into said peripheral area of said semiconductor substrate to electrically connect with each of said ground-potential contact pads.

16. An integrated circuit chip comprising:
    an integrated circuit chip semiconductor substrate;
    a plurality of active integrated circuit chip elements carried on said semiconductor substrate;
    an integrated circuit chip passivating layer carried atop said active integrated circuit chip elements; and
    an electrically conductive integrated circuit chip ground plane structure carried atop said passivating layer;
    said ground plane having configuration to connect to all of said integrated circuit chip elements requiring a ground contact to provide a single, common ground potential;
    said ground plane formed of a single conductor metal layer having a first approximate predetermined thickness and a single barrier layer below said conductor layer having a second approximate predetermined thickness; and
    said substrate defining a central area within which said active integrated circuit chip elements are defined, said ground plane structure covering substantially all of said central area.

17. The integrated circuit chip of claim 16 wherein said barrier metal includes a tungsten-titanium alloy.

18. The integrated circuit chip of claim 16 wherein said barrier metal layer has a thickness of substantially 3000 angstroms.

19. The integrated circuit chip of claim 16 wherein said conductor metal layer includes metallic gold.

20. The integrated circuit chip of claim 16 wherein said conductor metal layer has a thickness of substantially 2000 angstroms.

21. The integrated circuit chip of claim 16 wherein said passivating layer includes materials selected from the group consisting of silicon dioxide, silicon nitride, and polyimide.

22. The integrated circuit chip of claim 16 wherein said semiconductor substrate defines a peripheral area surrounding said central area and carrying therein plural electrical contact pads for electrically interfacing said integrated circuit chip with external electrical circuitry, said plural electrical contact pads including ground-potential contact pads, and said ground plane structure extending into said peripheral area of said substrate to electrically connect with each of said ground-potential contact pads.

23. An integrated circuit chip comprising:
    an integrated circuit chip semiconductor substrate;
    an integrated circuit chip morphology including a plurality of active integrated circuit chip elements carried on said semiconductor substrate;
    an integrated circuit chip passivating layer carried atop said morphology; and
    an integrated circuit chip ground plane structure carried atop said passivating layer, said ground plane structure electrically connecting with each of the ground-potential contacts of said active integrated circuit chip elements.

24. The integrated circuit chip of claim 23 wherein said semiconductor substrate comprises silicon.

25. The integrated circuit chip of claim 23 wherein said plurality of active integrated circuit chip elements include transistors or diodes.

26. The integrated circuit chip of claim 23 wherein said passivating layer is a sputtered thin film.

27. The integrated circuit chip of claim 23 wherein said passivating layer is a vapor-phase deposited film.

28. The integrated circuit chip of claim 23 wherein said ground plane structure is a sputtered thin film.

29. The integrated circuit chip of claim 23 wherein said ground plane structure is an electroplated thin film.

30. The integrated circuit chip of claim 23 wherein said ground plane structure is a vapor-phase deposited thin film.

31. The integrated circuit chip of claim 23 wherein said semiconductor substrate defines a central area within which said active integrated circuit chip elements are defined, said ground plane structure covering substantially all of said central area.

32. The integrated circuit chip of claim 31 wherein said semiconductor substrate defines a peripheral area surrounding said central area and carrying therein plural electrical contact pads for electrically interfacing said integrated circuit chip with external electrical circuitry, said plural electrical contact pads including ground-potential contact pads, and said ground plane structure extending into said peripheral area of said semiconductor substrate to electrically connect with each of said ground-potential contact pads.

33. The integrated circuit chip of claim 32 further comprising an upwardly-extending, electrically-conductive integrated circuit chip metallic bump structure carried upon each of said contact pads.

34. The integrated circuit chip of claim 32 further comprising wire bonds connected to each of said contact pads.

35. The integrated circuit chip of claim 23 wherein said ground plane structure connects to all of said active integrated circuit chip elements requiring a ground contact to provide a single, common ground potential.

36. The integrated circuit chip of claim 23 wherein said ground plane structure includes a layer of barrier metal carried atop said passivating layer, and a layer of conductor metal carried atop said layer of barrier metal.

37. An integrated circuit chip comprising:

an integrated circuit chip semiconductor substrate;

a plurality of active integrated circuit chip elements carried on said semiconductor substrate;

an integrated circuit chip passivating layer carried atop said active integrated circuit chip elements; and an integrated circuit chip ground plane structure carried atop said passivating layer;

said semiconductor substrate defining a central area within which said active integrated circuit chip elements are defined; and said ground plane structure covering substantially all of said central area.

38. The integrated circuit chip of claim 37 wherein said semiconductor substrate comprises silicon.

39. The integrated circuit chip of claim 37 wherein said plurality of active integrated circuit chip elements include transistors or diodes.

40. The integrated circuit chip of claim 37 wherein said passivating layer is a sputtered thin film.

41. The integrated circuit chip of claim 37 wherein said passivating layer is a vapor-phase deposited thin film.

42. The integrated circuit chip of claim 37 wherein said passivating layer includes materials selected from the group consisting of silicon dioxide, silicon nitride, and polyimide.

43. The integrated circuit chip of claim 37 wherein said ground plane structure is a sputtered thin film.

44. The integrated circuit chip of claim 37 wherein said ground plane structure is an electroplated thin film.

45. The integrated circuit chip of claim 37 wherein said ground plane structure is a vapor-phase deposited thin film.

46. The integrated circuit chip of claim 37 wherein said ground plane structure includes a layer of barrier metal carried atop said passivating layer, and a layer of conductor metal carried atop said layer of barrier metal.

47. The integrated circuit chip of claim 46 wherein said barrier metal includes a tungsten-titanium alloy.

48. The integrated circuit chip of claim 46 wherein said barrier metal layer has a thickness of substantially 3000 angstroms.

49. The integrated circuit chip of claim 46 wherein said conductor metal layer includes gold.

50. The integrated circuit chip of claim 46 wherein said conductor metal layer has a thickness of substantially 2000 angstroms.

51. The integrated circuit chip of claim 37 wherein said semiconductor substrate defines a peripheral area surrounding said central area and carrying therein plural electrical contact pads for electrically interfacing said integrated circuit chip with external electrical circuitry, said plural electrical contact pads including ground-potential contact pads, and said ground plane structure extending into said peripheral area of said semiconductor substrate to electrically connect with each of said ground-potential contact pads.

* * * * *